US007965541B2

United States Patent
Li et al.

(10) Patent No.: US 7,965,541 B2
(45) Date of Patent: Jun. 21, 2011

(54) NON-VOLATILE SINGLE-EVENT UPSET TOLERANT LATCH CIRCUIT

(75) Inventors: Bin Li, Chantilly, VA (US); John C. Rodgers, Fairfax, VA (US); Nadim F. Haddad, Oakton, VA (US)

(73) Assignees: BAE Systems Information and Electronic Systems Integration Inc., Nashua, NH (US); Ovonyx, Inc., Rochester Hills, MI (US)

( * ) Notice: Subject to any disclaimer, the term of this patent is extended or adjusted under 35 U.S.C. 154(b) by 84 days.

(21) Appl. No.: 12/525,458

(22) PCT Filed: Nov. 25, 2008

(86) PCT No.: PCT/US2008/084714
§ 371 (c)(1),
(2), (4) Date: Jul. 31, 2009

(87) PCT Pub. No.: WO2009/070595
PCT Pub. Date: Jun. 4, 2009

(65) Prior Publication Data
US 2010/0027321 A1 Feb. 4, 2010

Related U.S. Application Data

(60) Provisional application No. 60/991,390, filed on Nov. 30, 2007.

(51) Int. Cl.
*G11C 11/00* (2006.01)
(52) U.S. Cl. .................. 365/156; 365/154; 365/163
(58) Field of Classification Search .................. 365/148, 365/154, 156, 158, 163
See application file for complete search history.

(56) References Cited

U.S. PATENT DOCUMENTS

| | | | |
|---|---|---|---|
| 4,646,266 A | 2/1987 | Ovshinsky et al. | |
| 4,725,981 A | 2/1988 | Rutledge | |
| 4,809,226 A | 2/1989 | Ochoa, Jr. | |
| 4,956,814 A | 9/1990 | Houston | |
| 4,995,000 A | 2/1991 | Terrell | |
| 5,301,146 A | 4/1994 | Hama | |
| 6,060,926 A | 5/2000 | Campbell | |
| 6,271,568 B1 * | 8/2001 | Woodruff et al. | 257/379 |
| 6,531,373 B2 | 3/2003 | Gill et al. | |
| 6,847,543 B2 * | 1/2005 | Toyoda et al. | 365/154 |
| 7,468,904 B2 * | 12/2008 | Lawson et al. | 365/154 |
| 7,499,315 B2 * | 3/2009 | Lowrey et al. | 365/163 |
| 2004/0105301 A1 * | 6/2004 | Toyoda et al. | 365/154 |
| 2004/0165417 A1 | 8/2004 | Lesea | |
| 2004/0165418 A1 | 8/2004 | Lesea | |
| 2006/0171194 A1 * | 8/2006 | Lowrey et al. | 365/154 |
| 2007/0103961 A1 | 5/2007 | Roper et al. | |
| 2007/0165446 A1 | 7/2007 | Oliva et al. | |

\* cited by examiner

*Primary Examiner* — Gene N. Auduong
(74) *Attorney, Agent, or Firm* — Dillon & Yudell, LLP; Antony P. Ng; Daniel J. Long

(57) ABSTRACT

A non-volatile single-event upset (SEU) tolerant latch is disclosed. The non-volatile SEU tolerant latch includes a first and second inverters connected to each other in a cross-coupled manner. The gates of transistors within the first inverter are connected to the drains of transistors within the second inverter via a first feedback resistor. Similarly, the gates of transistors within the second inverter are connected to the drains of transistors within the first inverter via a second feedback resistor. The non-volatile SEU tolerant latch also includes a pair of chalcogenide memory elements connected to the inverters for storing information.

11 Claims, 3 Drawing Sheets

NON-VOLATILE SINGLE-EVENT UPSET TOLERANT LATCH CIRCUIT

PRIORITY CLAIM

The present application claims benefit of priority under 35 U.S.C. §365 to the previously filed international patent application number PCT/US2008/084714 filed on Nov. 25, 2008, assigned to the assignee of the present application, and having a priority date of Nov. 30, 2007, based upon U.S. provisional patent application No. 60/991,390. The contents of both applications are incorporated herein by reference.

STATEMENT OF GOVERNMENT INTEREST

The present invention was made with United States Government assistance under Contract No. FA9453-04-C-0052. The United States Government has certain rights in the present invention.

BACKGROUND OF THE INVENTION

1. Technical Field

The present invention relates to memory devices in general, and in particular to chalcogenide memory devices. Still more particularly, the present invention relates to a non-volatile single-event upset tolerant latch circuit.

2. Description of Related Art

In certain environments, such as satellite orbital space, in which the level of radiation is relatively intense, memory devices, such as static random access memories (SRAMs), are more susceptible to single-event upsets (SEUs) or soft errors than they would have in terrestrial environments. These SEUs are typically caused by electron-hole pairs created by, and travelling along the path of, a single energetic particle as it passes through the memory cells of the SRAMs. Should the energetic particle generate a critical charge within a storage node of an SRAM cell, the logic state of the SRAM cell will be upset. By the same token, other circuits used in conjunction with SRAMs are also susceptible to SEUs.

In the existing re-programmable SRAM-based field programmable gate arrays (FPGAs), a device configuration is typically stored in the volatile SRAM cells and must be reloaded at each power-up. Non-volatile FPGAs having flash memories can be utilized to store device configurations, but the flash memory cells are not radiation tolerant either, and there are reliability limitations for flash memory cells.

SUMMARY OF THE INVENTION

In accordance with a preferred embodiment of the present invention, a non-volatile single-event upset (SEU) tolerant latch is utilized to store device configurations. The non-volatile SEU tolerant latch includes a first and second inverters connected to each other in a cross-coupled manner. The gates of transistors within the first inverter are connected to the drains of transistors within the second inverter via a first feedback resistor. Similarly, the gates of transistors within the second inverter are connected to the drains of transistors within the first inverter via a second feedback resistor. The non-volatile SEU tolerant latch also includes a pair of chalcogenide memory elements connected to the inverters for storing information.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
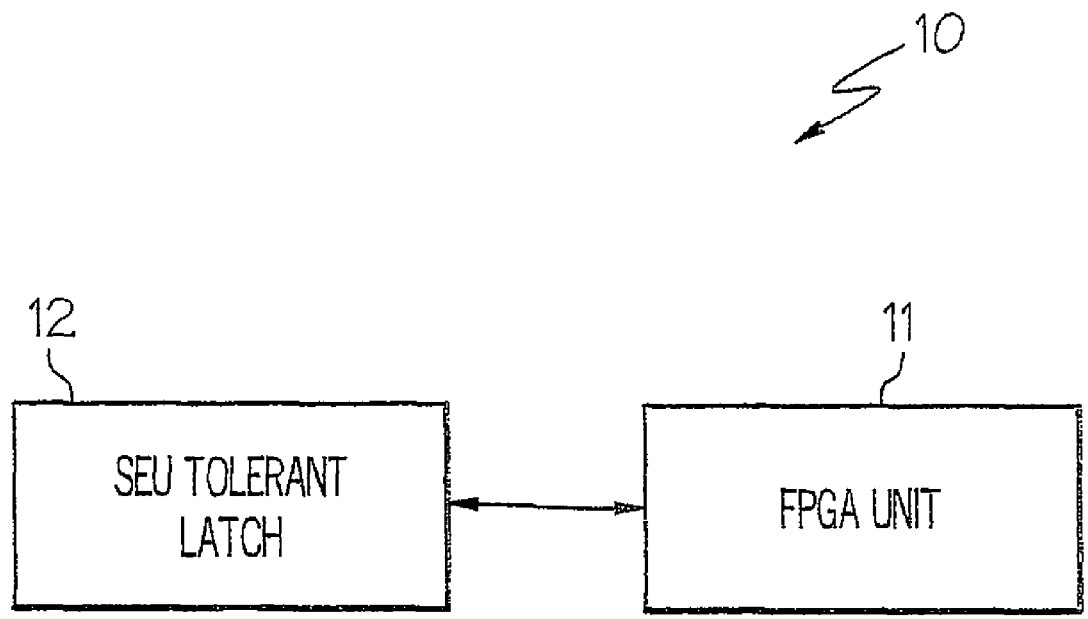
FIG. 1 is a block diagram of a field programmable gate array system, in accordance with a preferred embodiment of the present invention.

Referring now to the drawings and in particular to FIG. 1, there is illustrated a block diagram of a field programmable gate array (FPGA) system, in accordance with a preferred embodiment of the present invention. As shown, a FPGA system 10 includes a FPGA unit 11 coupled to non-volatile single-event upset (SEU) tolerant latches 12. FPGA unit 11 includes a FPGA array. Non-volatile SEU tolerant latches 12 includes a bank of SEU tolerant latches capable of functioning as a configuration management unit for storing data from a static random access memory unit (not shown), and for retaining the data after system shut down. For example, device configurations from FPGA unit 11 can be stored in non-volatile SEU tolerant latches 12 before system shut down, and can be reloaded from non-volatile SEU tolerant latches 12 back to FPGA unit 11 at each power-up.

Figure 2:
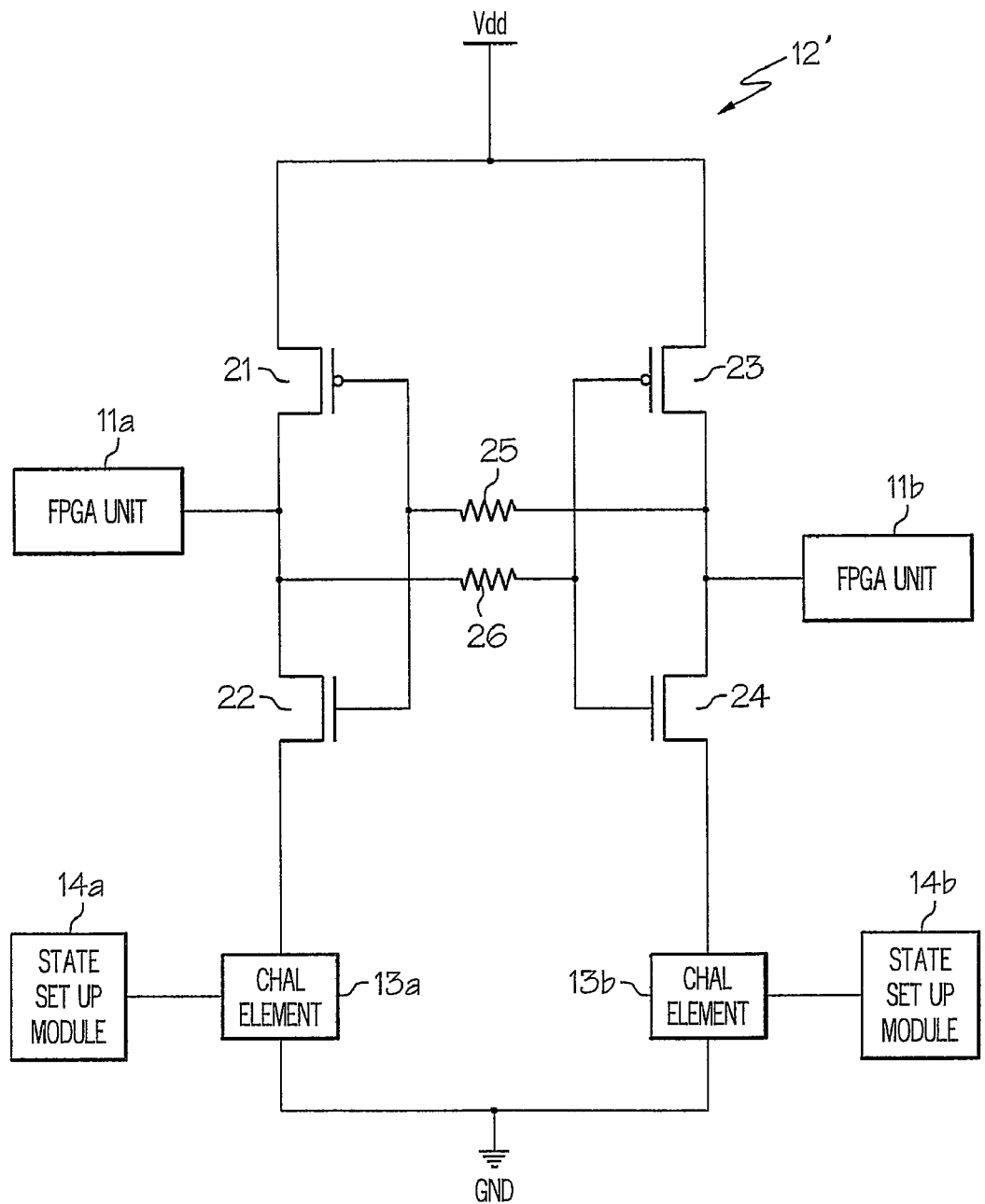
FIG. 2 is a circuit diagram of a non-volatile single-event upset tolerant latch circuit for the field programmable gate array system of FIG. 1, in accordance with a preferred embodiment of the present invention.

With reference now to FIG. 2, there is depicted a circuit diagram of one of non-volatile SEU tolerant latches 12, in accordance with a preferred embodiment of the present invention. As shown, a non-volatile SEU tolerant latch 12' includes two cross-coupled complementary metal oxide semiconductor (CMOS) inverters. The first inverter includes a p-channel transistor 21 connected in series with an n-channel transistor 22. The second inverter includes a p-channel transistor 23 connected in series with an n-channel transistor 24. The gates of transistors 21 and 22 are connected to the drains of transistors 23 and 24 via a feedback resistor 25, and the gates of transistors 23 and 24 are connected to the drains of transistors 21 and 22 via a feedback resistor 26. The resistances of feedback resistors 25 and 26 are greater than zero ohm. The higher the resistance values, the more tolerant non-volatile SEU tolerant latch 12' towards SEU.

The first inverter is connected to ground via a chalcogenide memory element 13a. Similarly, the second inverter is connected to ground via a chalcogenide memory element 13b. Chalcogenide, which preferably includes germanium, antimony and tellurium, can be made to have phase transformation properties at a relatively low voltage. Thus, each of chalcogenide memory elements 13a and 13b can be placed in an amorphous state or a crystalline state, which is utilized to represent a logical "0" and a logical "1," respectively. The state of each of chalcogenide memory elements 13a and 13b can be changed from one to another via the application of a current field accordingly. For the present application, the logical states of chalcogenide memory elements 13a and 13b are always complementary to each other.

The device configuration information can be loaded from FPGA units 11a and 11b into chalcogenide memory elements 13a and 13b, respectively, for the purpose of storage. During system start-up, the stored device configuration information is automatically reloaded from chalcogenide memory elements 13a and 13b back to FPGA units 11a and 11b, respectively.

State set up modules 14a and 14b determine the initial state of non-volatile SEU tolerant latch 12. For example, the initial state of non-volatile SEU tolerant latch 12 can be reset by utilizing state set up modules 14a and 14b before the device configuration information is loaded from FPGA units 11a and 11b.

Figure 3:
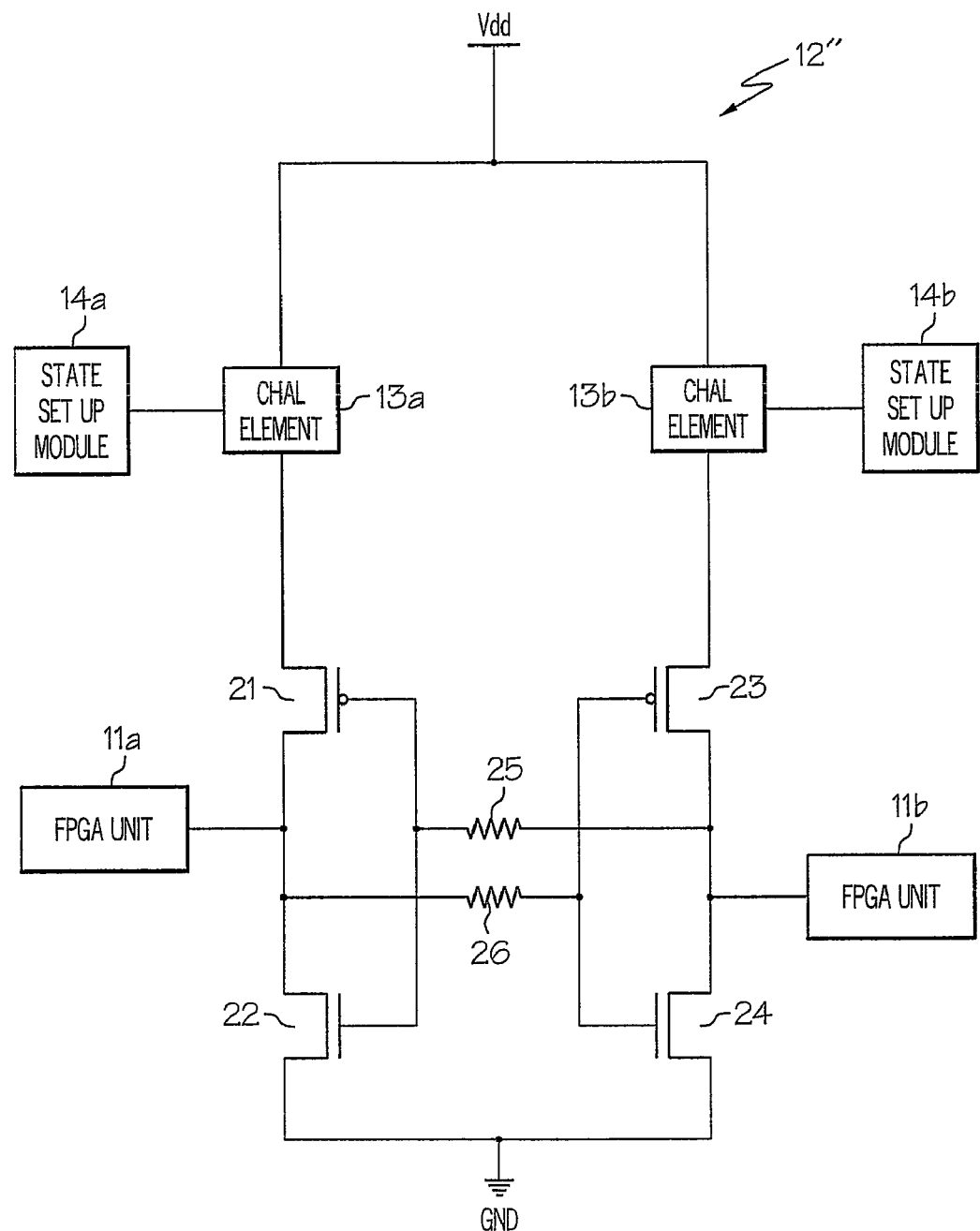
FIG. 3 is a circuit diagram of a non-volatile single-event upset tolerant latch circuit for the field programmable gate array system of FIG. 1, in accordance with an alternative embodiment of the present invention.

Referring now to FIG. 3, there is depicted a circuit diagram of a non-volatile SEU latch 12", in accordance with an alternative embodiment of the present invention. As shown, chalcogenide memory element 13a along with state set up module 14a are connected between $V_{DD}$ and p-channel transistor 21. Similarly, chalcogenide memory element 13b along with state set up module 14b are connected between $V_{DD}$ and p-channel transistor 23. The functionalities of non-volatile SEU latch circuit 12' are identical to those of non-volatile SEU latch 12' in FIG. 2.

As has been described, the present invention provides a non-volatile SEU tolerant latch for storing device configurations. Since the cross-coupled CMOS inverters are SEU tolerant and chalcogenide memory elements are immune to SEU, the entire FPGA system is SEU tolerant.

While the invention has been particularly shown and described with reference to a preferred embodiment, it will be understood by those skilled in the art that various changes in form and detail may be made therein without departing from the spirit and scope of the invention.

What is claimed is:

1. A field programmable gate array (FPGA) system comprising:
    a first and second inverters connected to each other in a cross-coupled manner, wherein gates of transistors within said first inverter are connected to drains of transistors within said second inverter via a first feedback resistor, and gates of transistors within said second inverter are connected to drains of transistors within said first inverter via a second feedback resistor;
    a first FPGA unit connected to said drains of transistors within said first inverter;
    a second FPGA unit connected to said drains of transistors within said second inverter;
    a first chalcogenide memory element, connected to said first inverter, for receiving and storing device configuration information from said first FPGA unit; and
    a second chalcogenide memory elements, connected to said second inverters, for receiving and storing device configuration information from said second FPGA unit.

2. The FPGA system of claim 1, wherein said first inverter includes a p-channel transistor connected in series with an n-channel transistor.

3. The FPGA system of claim 1, wherein said second inverter includes a p-channel transistor connected in series with an n-channel transistor.

4. The FPGA system of claim 1, wherein said first inverter is connected to ground via a first one of said chalcogenide memory elements.

5. The FPGA system of claim 4, wherein said second inverter is connected to ground via a second one of said chalcogenide memory elements.

6. The FPGA system of claim 1, wherein said first inverter is connected to $V_{DD}$ via a first one of said chalcogenide memory elements.

7. The FPGA system of claim 6, wherein said second inverter is connected to $V_{DD}$ via a second one of said chalcogenide memory elements.

8. The FPGA system of claim 1, wherein said chalcogenide includes germanium, antimony and tellurium.

9. The FPGA system of claim 1, wherein said FPGA system further includes a first state set up module connected to said first chalcogenide memory element, wherein said first state set up module defines an initial state of said first chalcogenide memory element.

10. The FPGA system of claim 9, wherein said FPGA system further includes a second state set up module connected to said second chalcogenide memory element, wherein said second state set up module defines an initial state of said second chalcogenide memory element.

11. The FPGA system of claim 1, wherein device configuration information are automatically loaded from said first and second chalcogenide memory elements to said first and second FPGA units, respectively, during system start-up.

* * * * *